United States Patent
Suzuki et al.

(10) Patent No.: US 7,976,956 B2
(45) Date of Patent: *Jul. 12, 2011

(54) LAMINATED CIRCUIT BOARD

(75) Inventors: Yuuji Suzuki, Nikkou (JP); Yuuki Kikuchi, Nikkou (JP); Satoru Zama, Tokyo (JP)

(73) Assignees: Furukawa Circuit Foil., Ltd., Nikkou (JP); The Furukawa Electric Co., Ltd., Tokyo (JP)

( * ) Notice: Subject to any disclaimer, the term of this patent is extended or adjusted under 35 U.S.C. 154(b) by 515 days.

This patent is subject to a terminal disclaimer.

(21) Appl. No.: 11/594,134

(22) Filed: Nov. 8, 2006

(65) Prior Publication Data

US 2007/0110969 A1    May 17, 2007

Related U.S. Application Data

(63) Continuation-in-part of application No. 11/496,624, filed on Aug. 1, 2006, now abandoned.

(30) Foreign Application Priority Data

Aug. 1, 2005   (JP) ................. 2005-222316

(51) Int. Cl.
    *B32B 3/00*   (2006.01)
(52) U.S. Cl. ........ 428/609; 428/209; 428/607; 174/250; 174/264; 205/111; 205/125; 29/829; 29/831
(58) Field of Classification Search .................. 428/209, 428/553, 607, 675, 609; 174/250, 255, 264; 205/111, 125; 29/829, 831
    See application file for complete search history.

(56) References Cited

U.S. PATENT DOCUMENTS

| | | | | |
|---|---|---|---|---|
| 4,568,413 | A * | 2/1986 | Toth et al. | 156/151 |
| 5,114,543 | A * | 5/1992 | Kajiwara et al. | 205/152 |
| 5,366,814 | A * | 11/1994 | Yamanishi et al. | 428/607 |
| 5,800,930 | A * | 9/1998 | Chen et al. | 428/607 |
| 6,197,407 | B1 * | 3/2001 | Andou et al. | 428/209 |
| 6,346,335 | B1 * | 2/2002 | Chen et al. | 428/629 |
| 6,359,235 | B1 * | 3/2002 | Hayashi | 174/260 |
| 6,372,113 | B2 | 4/2002 | Yates et al. | |
| 6,451,441 | B1 * | 9/2002 | Nishimoto et al. | 428/461 |
| 6,660,406 | B2 * | 12/2003 | Yamamoto et al. | 428/615 |
| 6,924,043 | B2 * | 8/2005 | Suzuki et al. | 428/615 |
| 7,047,629 | B2 * | 5/2006 | Kokufu et al. | 29/831 |
| 7,052,779 | B2 | 5/2006 | Shinozaki | |
| 7,197,820 | B2 * | 4/2007 | Sugawa et al. | 29/847 |
| 7,223,481 | B2 * | 5/2007 | Suzuki et al. | 428/612 |
| 7,381,475 | B2 * | 6/2008 | Suzuki | 428/553 |
| 2001/0051282 | A1 | 12/2001 | Yates et al. | |
| 2004/0157080 | A1 | 8/2004 | Shinozaki | |

* cited by examiner

*Primary Examiner* — Cathy Lam
(74) *Attorney, Agent, or Firm* — Birch, Stewart, Kolasch & Birch, LLP

(57) ABSTRACT

A through-hole type laminated circuit board is given with high reliability of electrical connection using copper foil and conductive paste containing low melting point metal without generating harmful void and crack at boundary between the copper foil and conductive paste metal. The laminated circuit board is made by laminating a multiple number of resin boards with roughening treated copper foils at least on their one surface sides with roughening projection deposition of less than 150 mg/dm$^2$ to make surface roughness Rz of 0.3 to 10 μm and height of the projection to be 0.3 to 10 μm. Surface roughness of the original foil is 0.1 to 5 μm and the amount of copper metal atoms of roughening treated layer is set at 4 times or less than the amount of diffusible conductive paste metal atoms containing low melting point metal into the roughening treated layer on the foil surface.

3 Claims, 2 Drawing Sheets

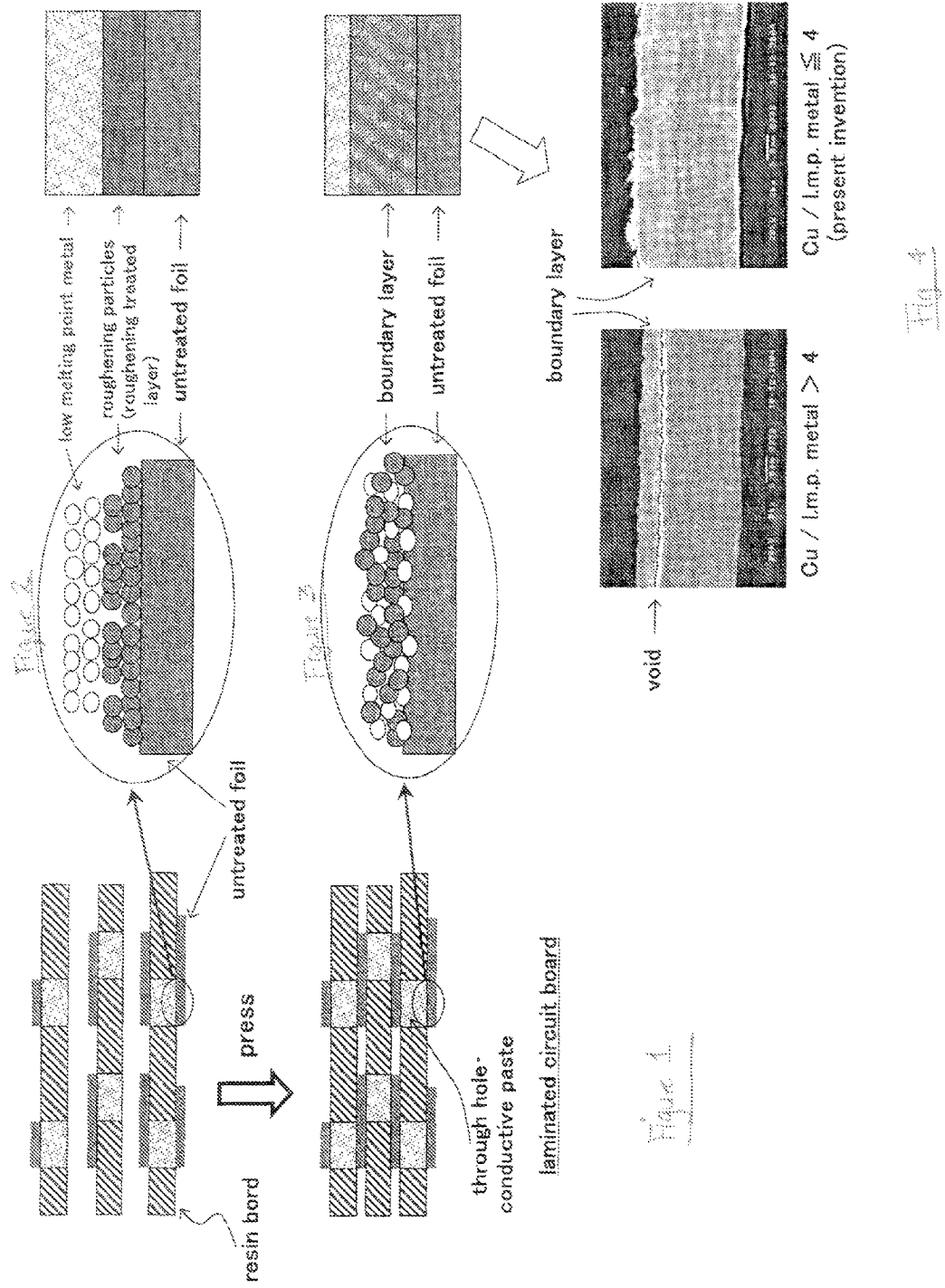

FIGURE 5
(A) 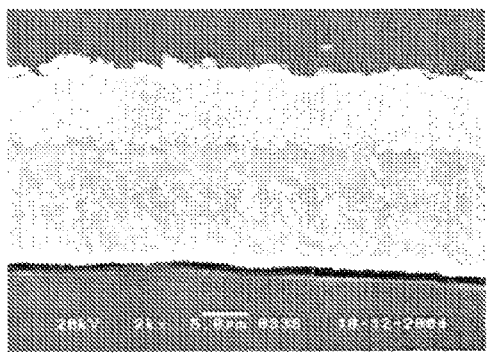
(B) 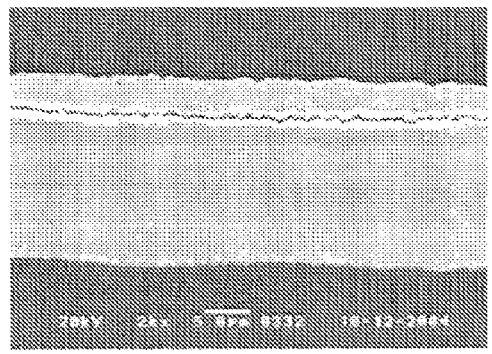

LAMINATED CIRCUIT BOARD

This application is a Continuation-In-Part of co-pending application Ser. No. 11/496,624, filed on Aug. 1, 2006, the entire contents of which are hereby incorporated by reference and for which priority is claimed under 35 U.S.C. §120.

BACKGROUND OF THE INVENTION

1. Field of the Invention

The present invention relates to a laminated circuit board (multilayered printed circuit board) provided with copper foil wiring on both sides which are electrically connected by electric conductive material such as conductive metal paste.

2. Description of the Related Art

A conventional laminated circuit board is produced by through hole plating method which is composed of steps of laminating plural multilayered circuit boards, opening drill holes through the whole layers and plating the surface of inner wall of the holes to obtain plating layer for electrical connection.

The advantage of the laminated circuit board made by the through hole plating method is low and stable electric resistance between the respective circuit layers by the plated holes.

However its disadvantage is the complicated process, high manufacturing cost and restriction of applicability of the boards due to the expensive board cost.

Another disadvantage of the plating method is that the holes do not accept electrical parts above them limiting the freedom of parts allocation, and to avoid this, special techniques are proposed such as to drilling the holes slantwise against the board surface.

Recently, this hole plating method has been partly replaced with laminated circuit board having interstitial via holes (IVH) filled with conductive metal paste. Printed circuit board using the conductive paste is more simplified process than the hole plating method thereby achieving lower cost. ALVIH (Any Layer Interstitial Via Hole) board manufactured by Matsushita Electric Co., Ltd is known as an example board applying the paste method.

Due to recent demand for further cost reduction by reducing or shortening of processes however, simultaneous press method has been developed for production of laminated circuit board utilizing conductive paste.

The conductive paste used for laminated board is mainly composed of silver or copper metal powder containing low melting point metals which enable the paste metal soften near at the press temperature for easy bonding resulting in improvement of the stability and time reduction of the production process.

The type and amount of the low melting point metal to be added into the silver or copper paste are determined considering the conductivity level and press temperature during the multilayered circuit board production.

When the laminated circuit board is press formed using the conductive paste containing low melting point metal (hereinafter, referred as conductive paste), however, a diffusion layer of copper and the low melting point metal can sometimes be formed on the copper foil surface which could cause disconnection between the foil and paste due to void and crack generation in the boundary thus seriously deteriorating the connection reliability.

SUMMARY OF THE INVENTION

The invention provides a novel laminated circuit board system to achieve high connection reliability by using conductive paste combined with a specifically surface roughening treated copper foil.

The untreated surface of original copper foil or copper alloy foil should have surface roughness of 0.1 to 5 µm at least on one surface side, roughening treated surface layer being formed with micro projections having surface roughness of Rz 0.3 to 10 µm, and a resin board is laminated with the copper foil provided with the conductive paste.

The original copper foil is surface treated to form projections having an average deposition of 150 mg/dm$^2$ or less and surface roughness of Rz 0.3 to 10 µm.

The luminosity value of one surface side of the roughening treated layer is 35 or less.

The original foil is an electrodeposited copper foil or electrodeposited copper alloy foil. Preferably, the original electrodeposited foil has a surface roughness of 2 µm or less at least on one surface side to be treated and is formed by granular crystals.

The roughening treated layer includes 200 to 150,000 projections in the foil surface area of 100 µm×100 µm and height of the projections is 0.3 to 3.0 µm preferably.

According to the present invention, a laminated circuit board giving high connection reliability can be provided without generating void and crack in the boundary layer between the copper foil and conductive paste.

DESCRIPTION OF THE PREFERRED EMBODIMENTS

In the present invention, a laminated circuit board is formed by laminating plurality of laminated boards which are made from laminating an insulation board to a surface treated copper foil of an original foil (original copper or copper alloy foil, hereinafter, called original foil) provided with a conductive paste on the roughening treated layer, where the surface treatment including a roughening projection layer of specific shape and distribution on the foil surface. Note that, the conductive paste can be provided on the roughening treated layer either over the entire surface of the treated layer or partially at a necessary portion near through holes.

The surface treated copper foil of the invention shows high bonding strength, can be processed in fine patterns. It prevents void generation at the boundary layer between the copper foil and conductive paste, resists heat process such as soldering and is applicable to lamination with insulating board of epoxy resin film, polyimide film, or liquid crystalline (mesomorphic) polymer film or polyetheretherketone based resin film having low variation in their dielectric characteristic due to low hygroscopicity.

Specifically, as for the insulation board, film composition containing 50% or more of epoxy resin, polyimide resin, and liquid crystalline (mesomorphic) polymers are suitable.

The inventors made extensive research to find cause of the void and crack generation at the boundary layer between the foil and paste and found that the void generation depended on the amount of diffusion of the low melting point metal to the roughened particle layer and the thickness (depth) of the diffusion layer.

Resulting knowledge of the surface roughness of original copper foil, amount and shape of deposited roughening particles and surface roughness of the foil to be covered with the conductive paste have lead to this invention.

The laminated circuit board by the invention uses the original foil with surface roughness Rz of 0.1 to 5 µm at least on its one side, and average amount of 150 mg/dm$^2$ of deposited roughening projections giving surface roughness Rz of 0.3 to 10 µm at least on the side to be covered with the conductive paste.

The original foil is a copper foil formed by electroplating or rolling. The foil is preferably in copper or copper alloy having thickness of 1 to 200 μm. The foil under 1 μm thick can be difficult to handle and one over 200 μm thick can be unpractical from the view point of high frequency property.

Concerning the restriction of the surface roughness Rz 0.1 to 5 μm of the original foil, the foil having surface roughness Rz under 0.1 μm is difficult to produce in practice. Although it can be produced, the cost will be prohibitive. While the original foil with Rz over 5.0 μm may be used, the high frequency property and fine pattern availability prefer 5.0 μm or less. The more preferred Rz of original foil is 2.0 μm or less. The original foil is required to have good flexibility because of possible crack generation during press process at high temperature to form the laminated circuit board using the conductive paste.

A copper foil made of granular crystal is preferred for its excellent flexibility. Specifically, the average size of granular crystal is preferably 0.3 μm or larger. The foil having 10% or more of crystal size of 1 μm or larger observed in its cross section is more preferable.

In this invention, the original foil is treated on its surface. The surface roughening treatment is to deposit roughening particles on the foil to thereby obtain Rz of 0.3 to 10.0 μm at least on the roughened surface side. The peel strength becomes weak when the surface roughness Rz is under 0.3 μm, while, high frequency property and fine patterning capability are degraded when the Rz is over 10.0 μm.

Thus the surface roughness is most preferably 3 μm or less.

As described above, depending on the amount of copper or copper alloy deposited on original foil by the roughening treatment, the low melting point metal contained in the paste diffuses in to the roughening particles, which may sometimes generate void or crack at the boundary between the copper foil and the paste due to the nature of the alloy composed.

Although the generation of the void or crack depends on the type of low melting point metal, however, the critical condition is the number of copper atoms of the roughening particles is less than four times compared to that of the low melting point metal atoms capable of diffusion. However, adding too much low melting point metal is not welcome since it increases electric resistance of the printed circuit.

Therefore, the amount of copper or copper alloy deposited on the original foil should be as low as possible and is preferably 1 to 150 mg/dm$^2$. When the deposition is 1 mg/dm$^2$ or less, the peel strength is not satisfactory, while the deposition of over 150 mg/dm$^2$ is also not desired because of too high electric resistance of the paste due to increased amount of diffusible low melting point metal atoms.

Note that, as described above, even for 150 mg/dm$^2$ or more of the amount of deposition, the generation of void or crack can be suppressed when the number of copper atoms of roughening layer is less than four times of low melting point metal atoms diffusing into the roughening particle layer. Hence, in case of asking for more peel strength ignoring the increase of electrical resistance of conductive paste, the surface treated copper foil with the suppression of void or crack generation is possible by maintaining the ratio between the roughening copper particles and the amount of low melting point metal.

The conductive paste containing 1 to 50% of low melting point metal to the main component (e.g., Ag, Cu) is particularly preferable for the laminated circuit board. The low melting point metal contained in the paste is preferably Zn, In, Sn, Pb, Bi, or alloy metal of the same and contains at least one of those metals. The surface treated copper foil desirably has a luminosity value of 35 or less after the roughening treated on its surface. The luminosity is defined as generally used for an index of surface roughness. As measuring method, a certain amount of light is irradiated to sample surface and the amount of reflected light is measured to be expressed as the luminosity value.

In the present embodiment, the luminosity is measured by a luminosity meter (SM color computer, Model number SM-4, made by Suga Test Instrument) after stain-proof treatment on the copper foil sample, which should be in the following range:

Ni: 0.01 to 0.5 mg/dm$^2$
Zn: 0.01 to 0.5 mg/dm$^2$
Cr: 0.01 to 0.3 mg/dm$^2$

On measuring the surface luminosity, in case of large surface roughness or deep depth between the roughening particles, the luminosity tends to be low due to less amount of light reflected. To improve the peel strength of the foil to insulation board, the luminosity value is preferably set at 35 or less.

When the luminosity is over 35, even with large surface roughness Rz, the relief shapes are flatter and the foil does not show improved bonding strength to insulation board.

Since the surface treated copper foil in the embodiment of this invention does not allow too much amount of deposition of roughening metal on the foil to suppress the void and crack induced by the conductive paste, an optimization of the shape of roughening surface is required to maintain high bonding strength with the insulation resin board.

To obtain adequate and uniform bonding ability throughout the surface area derived from the projections formed by the roughening particles, it is preferable to have 200 to 150,000 projections with the height of 0.3 to 3.0 μm in the surface area of 100 μm×100 μm. The height referred here is defined as the distance between surface of original foil and top of projections.

If the height of projections formed is under 0.3 μm, the peel strength is not enough, while suitability for fine patterning and high frequency property will be degraded when it is over 3.0 μm. The number of projections less than 200 in the unit area is not enough for stable bonding, while bonding ability becomes poor also when it is over 150,000.

Regarding the height of projection, it is checked by photograph observation of SEM picture of cross section of the surface treated copper foil which is taken after resin potting and polishing. The projections are preferably distributed in uniformity on the surface thereof.

The roughening particles forming the projections on the surface treated copper foil composing the composite board material of the present embodiment include Cu or Cu and Mo alloy particles or particles of Cu and at least one element of Ni, Co, Fe, Cr, V, and W.

While the desired projections may be obtained from Cu particles or Cu and Mo alloy particles, the projections formed by two or more types of roughening alloy particles made of Cu or Cu and Mo alloys including at least one element selected from the group of Ni, Co, Fe, Cr, V, and W are more effective because they can form more uniform particles. Since the roughening particles forming these projections are chemically bonded with the insulation resin, they area considered to improve the peel strength. While depending on resin type, the particle materials for improving the peel strength due to chemical bonding are Cu—Mo alloy, Cu—Ni alloy, Cu—Co alloy, Cu—Fe alloy, Cu—Cr alloy, Cu—Mo—Ni alloy, Cu—Mo—Cr alloy, Cu—Mo—Co alloy and Cu—Mo—Fe alloy.

The preferred content of at least one element selected from the group of Mo, Ni, Co, Fe, Cr, V, and W included in the alloy particles forming the projections is 0.01 PPM to 20% of the amount of copper metal. This is because the alloy becomes hard to be dissolved by etching of circuit pattern in later process when the added metal content is over 20%.

Furthermore, for obtaining uniform projections, it is desirable to optimize types of electroplating solution, current density, bath temperature and treatment time of the roughening treatment.

The surface formed with the projections is preferably provided with at least one metal plating layer selected from the group of Ni, Ni alloy, Zn, Zn alloy, and Ag to improve its tolerance to particle shedding, exposure to hydrochloric acid and high temperature and electrical conductivity of the circuit. In addition, the other surface where the projections are not formed is also preferably provided with at least one metal plating layer of Ni, Ni alloy, Zn, Zn alloy or Ag to improve the tolerance to exposure to hydrochloric acid and high temperature and electric conductivity. In order to achieve these objectives, the amount of metal deposition is desirably 0.05 to 10 mg/dm$^2$.

In particular, with liquid crystalline (mesomorphic) polymer resin, Ni or Ni alloy is effective for increasing the peel strength.

The surface treated copper foil having the above structure is coated with Cr and/or chromate layer for stain-proof treatment and if required, is subjected to a silane coupling treatment or both the stain-proof and silane coupling treatment.

EXAMPLES

More details of the invention will be explained with reference to specific examples, but it is not limited to these examples.

Original copper foil 1: Untreated electrodeposited and rolled copper foils (original foils) with thickness of 12 μm and matte side roughness Rz of 0.86 μm were prepared.

Original copper foil 2: Untreated electrodeposited copper foil with thickness of 12 μm and matte side roughness Rz of 1.24 μm was prepared.

Original copper foil 3: Untreated electrodeposited copper foil with thickness of 12 μm and matte side roughness Rz of 1.56 μm was prepared.

Examples 1 to 7

The original copper foils 1, 2 and 3 were respectively plated (roughening treated) by Electroplating A, B and C described below at least once in the order of Plating Baths 1 and then 2 under each plating conditions such as solution composition, bath temperature and current condition. The roughened sides were then plated with Ni (0.3 mg/dm$^2$) and Zn (0.1 mg/dm$^2$) and then subjected to chromate treatment.

Electroplating A
Plating Bath 1
Copper sulfate (as Cu metal): 1-10 g/dm$^3$
Sulfuric acid: 30-100 g/dm$^3$
Ammonium molybdate (as Mo metal): 0.1-5.0 g/dm$^3$
Current density: 10-60 A/dm$^2$
Current applying time: 1-20 sec
Bath temperature: 20-60° C.
Plating Bath 2
Copper sulfate (as Cu metal): 20-70 g/dm$^3$
Sulfuric acid: 30-100 g/dm$^3$
Current density: 5-45 A/dm$^2$
Current applying time: 1-25 sec
Bath temperature: 20-60° C.
Electroplating B
Plating Bath 1
Copper sulfate (as Cu metal): 1-50 g/dm$^3$
Nickel sulfate (as Ni metal): 3-25 g/dm$^3$
Ammonium metavanadate (as V metal): 0.1-15 g/dm$^3$
pH: 1.0-4.5
Current density: 10-60 A/dm$^2$
Current applying time: 5-20 sec
Bath temperature: 20-60° C.
Plating Bath 2
Copper sulfate (as Cu metal): 10-70 g/dm$^3$
Sulfuric acid: 30-120 g/dm$^3$
Current density: 20-50 A/dm$^2$
Current applying time: 5-25 sec
Bath temperature: 20-65° C.
Electroplating C
Plating Bath 1
Copper sulfate (as Cu metal): 1-50 g/dm$^3$
Cobalt sulfate (as Co metal): 1-50 g/dm$^3$
Ammonium molybdate (as Mo metal): 0.1-10 g/dm$^3$
pH: 0.5-4.0
Current density: 10-60 A/dm$^2$
Current applying time: 5-25 sec
Bath temperature: 20-60° C.
Plating Bath 2
Copper sulfate (as Cu metal): 10-70 g/dm$^3$
Sulfuric acid: 30-120 g/dm$^3$
Current density: 5-60 A/dm$^2$
Current applying time: 1-20 sec
Bath temperature: 20-65° C.

Comparative Examples 1 to 7

The original copper foils 1, 2 and 3 were respectively plated (roughening treated) by Electroplating D, E and F described below at least once in the order of Plating Baths 3 and then 4 under each plating conditions such as solution composition, bath temperature and current condition.

The roughened sides were then plated with Ni (0.3 mg/dm$^2$) and Zn (0.1 mg/dm$^2$) and then subjected to chromate treatment.

Electroplating D
Plating Bath 3
Copper sulfate (as Cu metal): 1-10 g/dm$^3$
Sulfuric acid: 30-100 g/dm$^3$
Ammonium molybdate (as Mo metal): 0.1-5.0 g/dm$^3$
Current density: 10-60 A/dm$^2$
Current applying time: 15-60 sec
Bath temperature: 20-60° C.
Plating Bath 4
Copper sulfate (as Cu metal): 20-70 g/dm$^3$
Sulfuric acid: 30-120 g/dm$^3$
Current density: 3 A/dm$^2$
Current applying time: 2 min or more (variable with surface roughness)
Bath temperature: 15° C.
Electroplating E
Plating Bath 3
Copper sulfate (as Cu metal): 1-50 g/dm$^3$
Nickel sulfate (as Ni metal): 3-25 g/dm$^3$
Ammonium metavanadate (as V metal): 0.1-15 g/dm$^3$
pH: 1.0-4.5
Current density: 10-60 A/dm$^2$
Current applying time: 15-60 sec
Bath temperature: 20-60° C.
Plating Bath 4
Copper sulfate (as Cu metal): 20-70 g/dm$^3$
Sulfuric acid: 30-120 g/dm$^3$ Current density: 3 A/dm$^2$
Current applying time: 2 min or more (variable with surface roughness)
Bath temperature: 15° C.
Electroplating F
Plating Bath 3
Copper sulfate (as Cu metal): 1-50 g/dm$^3$
Cobalt sulfate (as Co metal): 1-50 g/dm$^3$
Ammonium molybdate (as Mo metal): 0.1-10 g/dm$^3$
pH: 0.5-4.0
Current density: 10-60 A/dm$^2$
Current applying time: 15-60 sec
Bath temperature: 20-60° C.
Plating Bath 4
Copper sulfate (as Cu metal): 20-70 g/dm$^3$ The peel strengths of the obtained composite board above were measured. The peel direction is 180° according to JIS C6471. The results are shown in Table 1.

Verification of Suppression of Void Generation

Verification method of confirming the suppression of the void generation is performed in the following way. The roughening treated side of the foil was plated with Sn as low melting point metal up to 1.5 μm thick, and then heat treated at 320° C.

Cross section of the foil was observed by SEM and checked for the generated void and crack. The results are shown in table 1.

Note that, the number of void shown in table 1 is the ones found in the boundary layer between the roughening particles and original foil surface within the foil length of 200 μm.

TABLE 1

| Sample | Type of copper foil | Electro-Plating | Original foil | Deposition amount by treatment (mg/dm$^2$) | Ratio of number of copper atoms to Sn atoms | Treated surface roughness Rz (μm) | No. of projections having height of 0.3 to 3.0 μm in unit area (100 μm × 100 μm) | Luminosity | Film type | Peel strength (KN/m) | No. of void generation | Cracks |
|---|---|---|---|---|---|---|---|---|---|---|---|---|
| Ex. 1 | ED (electro-deposited) | A | 1 | 75 | 1.28 | 1.25 | 24500 | 24 | LC (liquid crystalline) | 0.35 | 0 | N |
| Ex. 2 | Rolled | B | 1 | 115 | 1.96 | 1.65 | 15400 | 23 | LC | 0.42 | 0 | N |
| Ex. 3 | ED | B | 2 | 115 | 1.96 | 1.97 | 15200 | 21 | LC | 0.45 | 0 | N |
| Ex. 4 | ED | C | 3 | 95 | 1.62 | 2.05 | 31500 | 22 | LC | 0.51 | 0 | N |
| Ex. 5 | ED | A | 1 | 65 | 1.11 | 1.21 | 65800 | 25 | PEEK (polyetheretherketone) | 0.31 | 0 | N |
| Ex. 6 | ED | B | 2 | 89 | 1.52 | 1.45 | 46500 | 22 | PEEK | 0.39 | 0 | N |
| Ex. 7 | ED | C | 3 | 120 | 2.05 | 2.15 | 13500 | 19 | PEEK | 0.46 | 0 | N |
| Comp. Ex. 1 | ED | D | 1 | 198 | 3.38 | 2.25 | 86 | 41 | LC | 0.35 | 37 | Y |
| Comp. Ex. 2 | Rolled | E | 1 | 256 | 4.37 | 2.57 | 142 | 39 | LC | 0.42 | 46 | Y |
| Comp. Ex. 3 | ED | E | 2 | 246 | 4.20 | 2.78 | 157 | 40 | LC | 0.45 | 54 | Y |
| Comp. Ex. 4 | ED | F | 3 | 216 | 3.69 | 2.65 | 178 | 42 | LC | 0.51 | 34 | Y |
| Comp. Ex. 5 | ED | D | 1 | 178 | 3.04 | 2.15 | 89 | 43 | PEEK | 0.31 | 31 | Y |
| Comp. Ex. 6 | ED | E | 2 | 225 | 3.84 | 2.48 | 98 | 37 | PEEK | 0.39 | 35 | Y |
| Comp. Ex. 7 | ED | F | 3 | 306 | 5.22 | 2.89 | 138 | 35 | PEEK | 0.46 | 62 | Y |

Sulfuric acid: 30-120 g/dm$^3$
Current density: 3 A/dm$^2$
Current applying time: 2 min or more (variable with surface roughness)
Bath temperature: 15° C.

The amount of deposited particles, surface roughness, number of projections and luminosity of roughening treated surface of the examples 1 to 7 and comparative examples 1 to 7 are shown in table 1.

Evaluation of Peel Strength of Surface Treated Copper Foil

The foils prepared as in the examples and comparative examples were laminated with liquid crystalline (mesomorphic) polymer film (hereinafter, referred to as film 1) or polyetheretherketone film (hereinafter, referred to as film 2) by the following lamination method, and their peel strength was measured.

Lamination Method of Film 1 and the Foil

The surface treated copper foil was laid over the film 1, pressed at 280° C. with a predetermined pressure for 10 minutes, and cooled to obtain a composite board material.

Lamination Method of Film 2 and the Foil

The surface treated copper foil was laid over the film 2, presses at 205° C. with a predetermined pressure for 10 minutes, and cooled to obtain a composite board material.

The treated copper foil for the laminated circuit board in this invention has the same level of peel strength as conventional foil with less amount of roughening deposition metal and smaller surface roughness Rz.

This product is more suitable to fine patterning because of uniformly performed treatment and provides conductive paste of low electric resistance due to less void and crack generation between the foil and paste boundary which will give way to wider application types of electronic equipments and apparatus in various fields.

While the invention has been described with reference to specific embodiments chosen for the purpose of illustration, it should be apparent that numerous modifications could be made thereto by those skilled in the art without departing from the basic concept and scope of the invention.

What is claimed is:

1. A laminated circuit board comprising:
    a surface treated copper foil, and
    a resin board laminated on the surface treated copper foil, the resin board comprising through holes, the through holes being filled with a conductive paste containing a low melting point metal, wherein the surface treated copper foil comprises an untreated foil and a layer comprising roughening particles thereon, the roughening particles comprising copper atoms, wherein the number of copper atoms in a boundary layer comprising roughening particles is four times or less than a number of low melting point metal atoms which diffuse from the conductive paste to the boundary layer comprising roughening particles, wherein the boundary layer is the region where a through hole comes in contact with said surface treated copper foil having roughening particles, wherein the surface treated copper foil includes projections of 200 to 150,000 having a height of 0.3 to 3.0 μm in the foil surface area of 100 μm×100 μm;

wherein luminosity of the surface of the roughening treated layer is 35 or less, wherein the roughening particles form projections in the layer comprising roughening particles, and wherein the surface roughness of the untreated foil is 0.1 to 5 μm at least on one surface, and the surface roughness of the surface treated copper foil is 0.3 to 10 μm.

2. The laminated circuit board as set forth in claim 1, wherein the untreated foil is an electrodeposited copper foil or electrodeposited copper alloy foil.

3. The laminated circuit board as set forth in claim 2, wherein the surface roughness of the untreated foil made of the electrodeposited copper foil is 0.1 to 2 μm at least on one side to be treated and is formed with granular crystals.

* * * * *

UNITED STATES PATENT AND TRADEMARK OFFICE
CERTIFICATE OF CORRECTION

| | |
|---|---|
| PATENT NO. | : 7,976,956 B2 |
| APPLICATION NO. | : 11/594134 |
| DATED | : July 12, 2011 |
| INVENTOR(S) | : Yuuji Suzuki et al. |

It is certified that error appears in the above-identified patent and that said Letters Patent is hereby corrected as shown below:

ON THE TITLE PAGE:

At item (73), Assignees, change:

"(73) Assignees: Furukawa Circuit Foil., Ltd., Nikkou (JP); The Furukawa Electric Co., Ltd., Tokyo (JP)"

to

--(73) Assignee: The Furukawa Electric Co., Ltd., Tokyo (JP)--.

Signed and Sealed this
Eighteenth Day of August, 2015

Michelle K. Lee
*Director of the United States Patent and Trademark Office*